(12) United States Patent
Colombara (10) Patent No.: US 12,094,712 B2
(45) Date of Patent: Sep. 17, 2024

(54) METHOD FOR PATTERNING A SURFACE OF A SUBSTRATE

(71) Applicant: INL—International Iberian Nanotechnology Laboratory, Braga (PT)

(72) Inventor: Diego Colombara, Braga (PT)

(73) Assignee: INL—International Iberian Nanotechnology Laboratory, Braga (PT)

(*) Notice: Subject to any disclaimer, the term of this patent is extended or adjusted under 35 U.S.C. 154(b) by 295 days.

(21) Appl. No.: 17/416,527

(22) PCT Filed: Dec. 18, 2019

(86) PCT No.: PCT/EP2019/086023
§ 371 (c)(1),
(2) Date: Jun. 21, 2021

(87) PCT Pub. No.: WO2020/136057
PCT Pub. Date: Jul. 2, 2020

(65) Prior Publication Data
US 2022/0076952 A1    Mar. 10, 2022

(30) Foreign Application Priority Data
Dec. 28, 2018  (EP) .................................. 18248130

(51) Int. Cl.
*H01L 21/033*  (2006.01)
*H01L 21/311*  (2006.01)
*H01L 21/32*   (2006.01)

(52) U.S. Cl.
CPC .... *H01L 21/0337* (2013.01); *H01L 21/31144* (2013.01); *H01L 21/32* (2013.01)

(58) Field of Classification Search
None
See application file for complete search history.

(56) References Cited

U.S. PATENT DOCUMENTS 5,676,853 A * 10/1997 Alwan .................... H01J 9/025
                                                       427/199
6,143,580 A * 11/2000 Wells .................... H01L 21/027
                                                       118/100

(Continued)

FOREIGN PATENT DOCUMENTS

ES    2174695 A1    11/2002

OTHER PUBLICATIONS

International Search Report and Written Opinion mailed on Feb. 18, 2020, received for PCT Application PCT/EP2019/086023, Filed on Dec. 18, 2019, 14 pages.

(Continued)

*Primary Examiner* — Allan W. Olsen
(74) *Attorney, Agent, or Firm* — LUCAS & MERCANTI, LLP (57) ABSTRACT

A method for patterning a surface of a substrate includes applying a liquid on the surface of the substrate, wherein an apparent viscosity of the liquid depends on a field strength applied to the liquid; applying a field to the liquid, wherein a field strength of the applied field is spatially varied in the liquid in a direction parallel to the surface of the substrate, thereby generating a spatially varied apparent viscosity distribution in the liquid in response to the applied field; and patterning the surface of the substrate by subjecting the surface to a surface modifying process, while maintaining the field and using portions of the liquid having apparent viscosities higher than a predetermined value as a mask; wherein the surface modifying process comprises removing material of the surface of the substrate and/or depositing material on the surface of the substrate.

11 Claims, 6 Drawing Sheets

(56) References Cited

U.S. PATENT DOCUMENTS

| | | | |
|---|---|---|---|
| 6,174,449 B1 | 1/2001 | Alwan et al. | |
| 6,445,093 B1 | 9/2002 | Binnard | |
| 7,846,642 B2 * | 12/2010 | Ofir | B81C 1/00031 |
| | | | 430/394 |
| 8,138,749 B1 | 3/2012 | Paranjape et al. | |
| 8,367,164 B2 * | 2/2013 | Kim | G11B 5/855 |
| | | | 427/547 |
| 2005/0275497 A1 | 12/2005 | Ramadan et al. | |
| 2007/0224517 A1 | 9/2007 | Yellen et al. | |
| 2008/0151207 A1 | 6/2008 | Nikitin | |
| 2008/0176109 A1 | 7/2008 | Kim et al. | |
| 2010/0012622 A1 * | 1/2010 | Panga | G03F 7/70483 |
| | | | 216/52 |
| 2010/0321335 A1 | 12/2010 | Lim et al. | |
| 2017/0154767 A1 * | 6/2017 | Mischitz | H01L 21/02203 |
| 2019/0084194 A1 * | 3/2019 | Keady | B29C 64/165 |
| 2020/0149588 A1 * | 5/2020 | Lampaert | F16C 33/109 |

OTHER PUBLICATIONS

Liu et al., "Nanostructure Formation via Print Diffusion Etching Through Block Copolymer Templates", Nanoscale, vol. 2, No. 4, Jan. 1, 2010, XP055593692, pp. 587-593.

Liu et al., "Pattern Transfer Using Poly(Styrene-block-methyl Methacrylate) Copolymer Films and Reactive Ion Etching", Journal of Vacuum Science and Technology, vol. 25, No. 6, XP012105399, Dec. 6, 2007, pp. 1963-1968.

* cited by examiner

METHOD FOR PATTERNING A SURFACE OF A SUBSTRATE

CROSS-REFERENCE TO RELATED APPLICATIONS

The present application is based on PCT filing PCT/EP2019/086023, filed Dec. 18, 2019, which claims priority to EP 18248130.9, filed Dec. 28, 2018, the entire contents of each are incorporated herein by reference.

TECHNICAL FIELD

The present invention relates to a method for patterning a surface of a substrate.

BACKGROUND OF THE INVENTION

The production of patterned surfaces is important in a range of different technical areas. For instance, in the production of semiconductor components such as solar panels and optical displays. A patterned surface is typically produced by transferring a pattern from a template to a target substrate, such as a wafer. The transfer can be performed by applying a sacrificial layer on top of the substrate, and then imprint an inverse of the pattern on the sacrificial layer. The patterned sacrificial layer is typically called a mask. The exposed parts of the substrate can then be etched or be deposited with material.

Problems associated with this process are many. For instance, the additional sacrificial layer applied to the substrate leads to additional processing steps, which in turn decreases production rates. It is also problematic to imprint the inverse of the pattern on the sacrificial layer, since it typically requires very expensive equipment, e.g. photolithography equipment. Another common issue is that after the exposed parts of the substrate have been etched or deposited with material, the sacrificial layer must be removed. However, it is difficult to remove the sacrificial layer without damaging the surface of the substrate wafer underneath the sacrificial layer. This problem often results in highly complex, and often expensive, removal processes. It can also lead to higher rejection rates of the produced patterned surfaces.

Therefore, there is a need for an improved method for patterning surfaces.

SUMMARY OF THE INVENTION

In view of the above, it is an object of the present invention to provide a method for patterning a surface on a substrate.

It is an object to mitigate, alleviate or eliminate one or more of the above-identified deficiencies in the art and disadvantages singly or in any combination and solve at least the above mentioned problem.

According to a first aspect, a method for patterning a surface of a substrate is provided. The method comprises: applying a liquid on the surface of the substrate, wherein an apparent viscosity of the liquid depends on a field strength applied to the liquid; applying a field to the liquid, wherein a field strength of the applied field is spatially varied in the liquid in a direction parallel to the surface of the substrate, thereby generating a spatially varied apparent viscosity distribution in the liquid in response to the applied field; and patterning the surface of the substrate by subjecting the surface to a surface modifying process, while maintaining the field and using portions of the liquid having apparent viscosities higher than a predetermined value as a mask; wherein the surface modifying process comprises removing material of the surface of the substrate and/or depositing material on the surface of the substrate.

The wording "field" should, within the context of this application, be construed as an external field, e.g. a magnetic field or an electric field.

The wording "field strength" should, within the context of this application, be construed as a field strength of the external field applied to an object.

The wording "apparent viscosity" should, within the context of this application, be construed as a viscosity of a liquid under specific conditions. For instance, the apparent viscosity of the liquid may be the viscosity of the liquid when a field is present in the liquid. The apparent viscosity may increase as particles in the liquid align in response to the applied field. The apparent viscosity may increase such that the liquid becomes quasi-solid or solid in response to an applied field. In the absence of a field, the apparent viscosity of the liquid is lower, allowing the liquid to flow. The apparent viscosity of the liquid is lower in the absence of an applied field since the particles in the liquid are not aligned. The apparent viscosity may decrease in response to the applied field. The apparent viscosity may decrease such that an initially quasi-solid becomes a liquid in response to an applied field. In such case, the apparent viscosity of the liquid is higher in the absence of an applied field.

The wording "predetermined value" should, within the context of this application, be construed as a viscosity value above which the apparent viscosity of the liquid is sufficiently high to effectively prevent the surface modifying process from modifying portions of the surface in contact with the liquid where the apparent viscosities exceed the predetermined value.

The substrate may be a solid substrate. The substrate may comprise a stack of layers. The substrate may comprise varied materials. The substrate may comprise different materials. The substrate may be a semiconductor wafer. The substrate may be a flexible substrate. The substrate may have a curved surface.

By means of the present method, the application of the mask on the surface of the substrate is simplified. Simplifying the application of the mask may reduce a number of processing steps compared to conventional methods, thereby increasing a production rate of the patterned surfaces. For instance, by means of the present method, a sacrificial layer imprinted using photolithography is not needed, thereby removing constraints introduced by a photolithography apparatus, e.g. size constraints etc. The present method may allow for patterning of very large substrates, e.g., substrates having a size on the order of meters. The present method may, however, be used in combination with conventional techniques.

A further advantage of the present method is that it may allow for patterning of substrates having non-planar surfaces. For example, the present method may allow for patterning of a substrate having a curved surface or a multi-faceted surface.

An advantage of the surface modifying process comprising removing material of the substrate is that it may allow for patterning of the surface of the substrate.

A further advantage of the surface modifying process comprising removing material of the substrate is that material of the substrate underneath the surface of the substrate may be exposed.

An advantage of the surface modifying process comprising depositing material on the surface of the substrate is that it may allow for patterning of the substrate.

A further advantage of the surface modifying process comprising depositing material on the surface of the substrate is that material different than the substrate may be deposited on the surface of the substrate. It may thereby be possible to realize a semiconducting or electrically insulating substrate having a surface comprising electrically conducting material.

The liquid may be a magnetorheological liquid and the field may be a magnetic field.

An advantage of the liquid being a magnetorheological liquid is that the apparent viscosity of the liquid may be affected by an external magnetic field.

An advantage of the liquid being a magnetorheological liquid is that the viscosity of the liquid may not be affected by an external electric field. It may thereby allow for surface modifying processes comprising applying electric fields.

The liquid may be an electrorheological liquid and the field may be an electric field.

An advantage of the liquid being an electrorheological liquid is that the apparent viscosity of the liquid may be affected by an external electric field.

The method may further comprise: prior to patterning the surface of the substrate, removing portions of the liquid having apparent viscosities lower than the predetermined value, thereby exposing corresponding portions of the surface of the substrate.

An advantage of removing the liquid and exposing portions of the surface prior to patterning the surface is that the surface modifying process may comprise chemical vapor deposition (CVD), sputtering, atomic layer deposition (ALD), and/or etching. Etching may be performed using gas phase, e.g. ashing or reactive ion etching (RIE).

The method may further comprise: applying a processing liquid to the exposed portions of the surface of the substrate, wherein the processing liquid is used in the surface modifying process.

An advantage of applying the processing liquid to the exposed portions of the surface of the substrate is that it may allow for additional surface modifying processes that utilizes a different processing liquid than the liquid with field-induced increased apparent viscosity.

The surface modifying process may comprise: applying a voltage between the processing liquid and the surface of the substrate, thereby depositing material species present in the processing liquid on the exposed portions of the surface of the substrate.

An advantage of applying a voltage between the processing liquid and the surface of the substrate, thereby depositing material species present in the processing liquid on the exposed portions of the surface of the substrate is that an electrically conductive material may be deposited.

The surface modifying process may comprise: applying a voltage between the liquid and the surface of the substrate, thereby depositing material species present in the liquid on the surface of the substrate.

An advantage of applying a voltage between the liquid and the surface of the substrate, thereby depositing material species present in the liquid on the surface of the substrate is that the liquid forming the mask may be used in the surface modifying process. Thereby, the process of patterning a surface may be simplified as a need for a different liquid in the surface modifying process is removed.

The surface modifying process may comprise: applying a deposition magnetic field in the liquid, thereby depositing material species present in the liquid on the surface of the substrate.

An advantage of applying a deposition magnetic field in the liquid, thereby depositing material species present in the liquid on the surface of the substrate is that the liquid forming the mask may be used in the surface modifying process. Thereby, the process of patterning a surface may be simplified as a need for a different liquid in the surface modifying process is removed. The material species deposited on the surface of the substrate may be fixated by a hardening process. The hardening process may be a chemical hardening process, and/or a heat-treatment process. The heat-treatment process may be a firing process. In other words, the material species may be bound together as well as to the surface of the substrate, thereby forming a stable deposited layer on the surface of the substrate.

The method may further comprise: subsequent to patterning the surface of the substrate, removing the applied field, thereby diminishing the spatially varied apparent viscosity distribution in the liquid.

An advantage of diminishing the spatially varied apparent viscosity distribution in the liquid is that the mask may be removed by removing the liquid. Thereby, the mask may be easier to remove without damaging the surface underneath the mask. The mask may therefore be removed without using other techniques, e.g., submerging in hot remover, ultra-sonic assisted removing techniques, lift-off or etching. Removing the mask without damaging the surface underneath the mask may lead to a lower rejection rate of the produced patterned surfaces, thereby decreasing costs related to a rejection of patterned surfaces.

The method may further comprise: applying a further field to the liquid, wherein a further field strength of the further field is spatially varied in the liquid in a direction parallel to the surface of the substrate, thereby generating a further spatially varied apparent viscosity distribution in the liquid in response to the applied further field; patterning the surface of the substrate by subjecting the surface to a further surface modifying process, while maintaining the further field and using portions of the liquid having apparent viscosities higher than a predetermined value as a further mask; removing the applied further field, thereby diminishing the further spatially varied apparent viscosity distribution in the liquid.

The surface of the substrate may comprise portions of the surface exposed in the previous surface modifying process. The surface of the substrate may comprise material deposited on the surface of the substrate in the previous surface modifying process.

An advantage of patterning the surface of the substrate by subjecting the surface to a further surface modifying process is that more complex surface patterns may be realized. For instance, the surface may be patterned in a plurality of different levels.

The method may further comprise: removing the liquid from the patterned surface of the substrate.

The wording "patterned surface" should, within the context of this application, be construed as a surface comprising the initial surface of the substrate and, if present, deposited material, and/or, if present, portions exposed by etching the initial surface. In other words, the "patterned surface" may be the upper surface of the substrate including material added to the surface in the surface modifying process or may be the upper surface of the substrate void of material removed in the surface modifying process or a combination thereof.

A further scope of applicability of the present disclosure will become apparent from the detailed description given below. However, it should be understood that the detailed description and specific examples, while indicating preferred variants of the present inventive concept, are given by way of illustration only, since various changes and modifications within the scope of the inventive concept will become apparent to those skilled in the art from this detailed description.

Hence, it is to be understood that this inventive concept is not limited to the particular steps of the methods described or component parts of the systems described as such method and system may vary. It is also to be understood that the terminology used herein is for purpose of describing particular embodiments only, and is not intended to be limiting. It must be noted that, as used in the specification and the appended claim, the articles "a", "an", "the", and "said" are intended to mean that there are one or more of the elements unless the context clearly dictates otherwise. Thus, for example, reference to "a unit" or "the unit" may include several devices, and the like. Furthermore, the words "comprising", "including", "containing" and similar wordings do not exclude other elements or steps.

BRIEF DESCRIPTION OF THE DRAWINGS

The above and other aspects of the present invention will now be described in more detail, with reference to appended drawings showing embodiments of the invention. The figures should not be considered limiting the invention to the specific embodiment; instead they are used for explaining and understanding the invention.

As illustrated in the figures, the sizes of layers and regions are exaggerated for illustrative purposes and, thus, are provided to illustrate the general structures of embodiments of the present invention. Like reference numerals refer to like elements throughout.

DETAILED DESCRIPTION

The present inventive concept will now be described more fully hereinafter with reference to the accompanying drawings, in which currently preferred variants of the inventive concept are shown. This inventive concept may, however, be implemented in many different forms and should not be construed as limited to the variants set forth herein; rather, these variants are provided for thoroughness and completeness, and fully convey the scope of the present inventive concept to the skilled person. At the end of this disclosure, specific implementations of the inventive concept will be described as detailed examples.

Figure 1A:
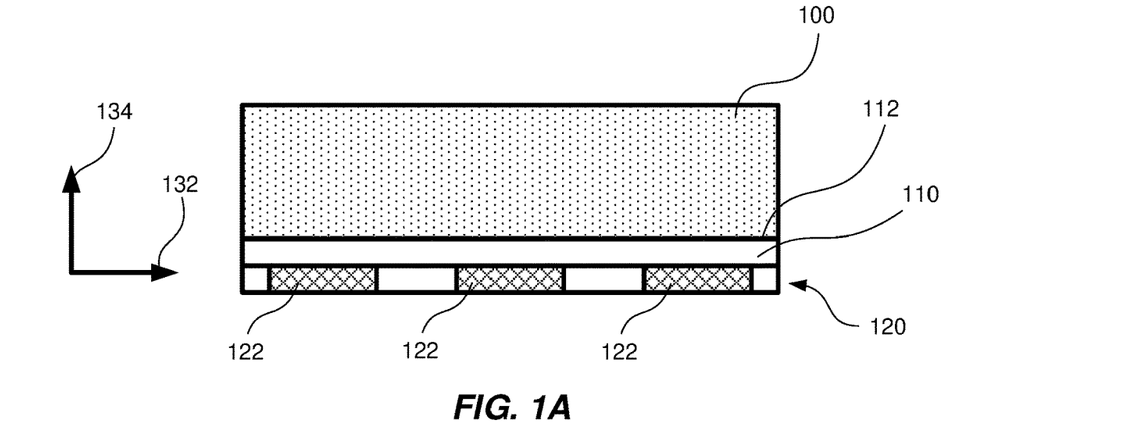
FIG. 1A illustrates a substrate, a liquid, and an assembler.

FIG. 1A illustrates a substrate 110, a liquid 100, and an assembler 120.

The substrate 110 may be suitable for semiconductor processes or optical applications, such as optical media or display applications. The substrate may be a silicon wafer, a silica substrate, a glass substrate, a III-V material wafer to give a few non-limiting examples. The size and shape may vary. Circular substrates generally in the range of 25-300 mm may be used for semiconductor processes or optical media, while rectangular substrates of significantly larger size, such as 1500 mm may be used for display applications. Other types, sizes and shapes of the substrate may be used to advantage. The substrate 110 may comprise a stack of layers. A layer in the stack of layers may be made of an electrically insulating material, a semiconducting material or an electrically conducting material. The substrate 110 comprises a surface 112 which is to be patterned. The surface 112 of the substrate 110 may be a smooth surface or a pre-patterned surface.

Figure 1B:
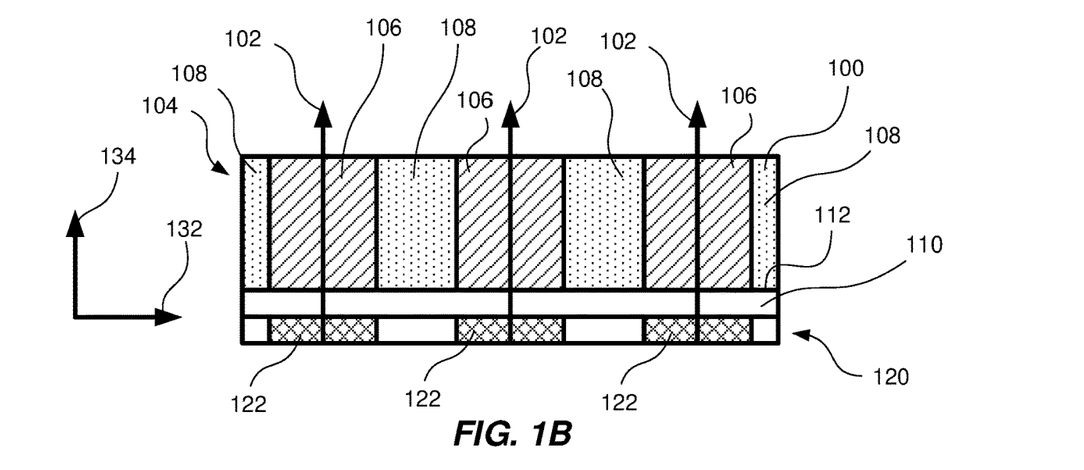
FIG. 1B illustrates the substrate with applied liquid, and an applied field generated by a field generator.
Figure 1C:
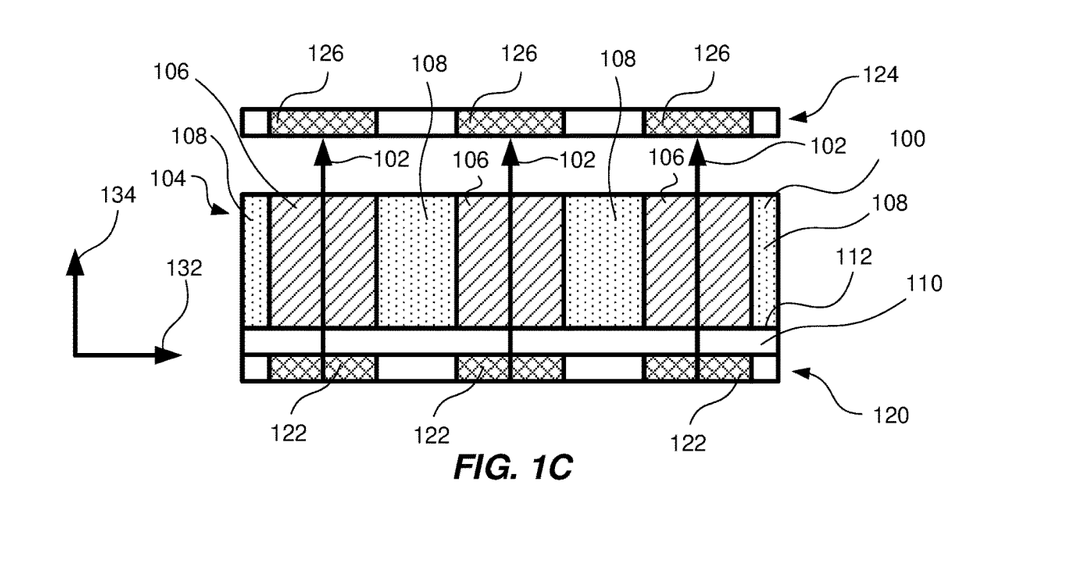
FIG. 1C illustrates the substrate with applied liquid, and an applied electric field.
Figure 5:
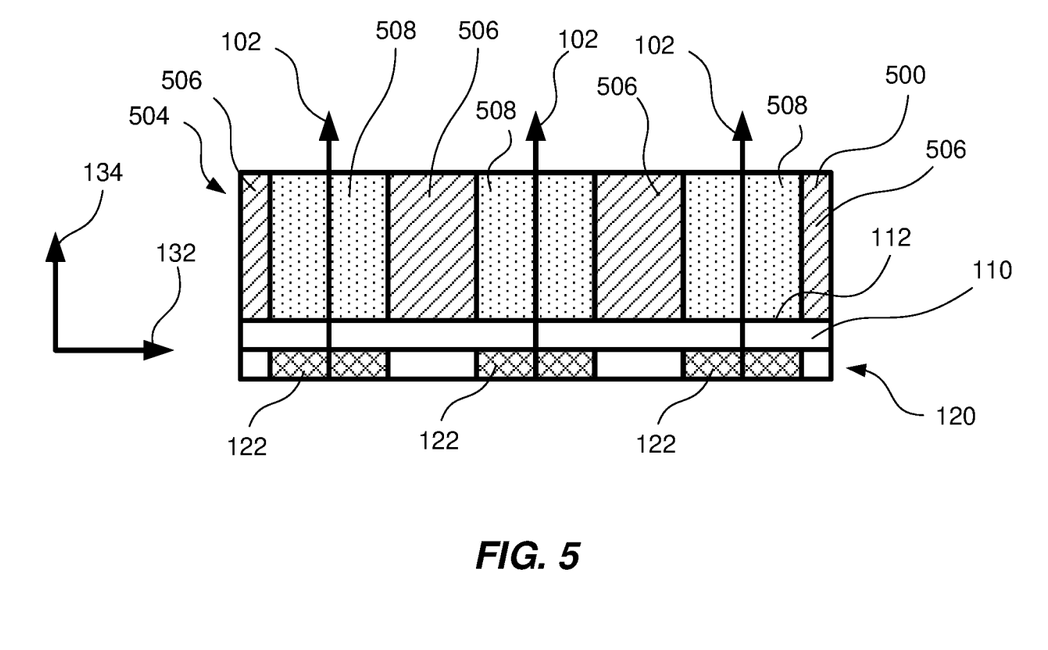
FIG. 5 illustrates the substrate with applied shear-thinning liquid, and an applied field generated by a field generator.

In FIG. 1A, a liquid 100 has been applied S302 on the surface 112 of the substrate 110. An apparent viscosity of the liquid 100 depends on a field strength applied to the liquid 100. The liquid 100 in the examples shown in FIG. 1 and FIG. 2 is a shear-thickening liquid. In other words, an apparent viscosity of the liquid 100 increases in response to an applied field. The liquid 500 in the example shown in FIG. 5 is a shear-thinning liquid. In other words, an apparent viscosity of the liquid 500 decreases in response to an applied field. A skilled person realizes how the description in relation to FIG. 1 and FIG. 2 may be adapted when using the shear-thinning liquid 500.

In FIG. 1B, a field 102 has been applied S304 to the liquid 100. The field 102 may be applied by the assembler 120, as exemplified in FIG. 1B. The assembler 120 may comprise a field generator 122. The assembler 120 may comprise a plurality of field generators. Each field generator 122 in the plurality of field generators may be electrically isolated from each other. The plurality of field generators may be arranged in a two-dimensional manner. The plurality of field generators may be arranged in a three-dimensional manner.

The applied field 102 is represented by an arrow in FIG. 1B-1C, in FIG. 2A-2E, and in FIG. 5, however, it is to be understood that an applied field 102 has a spatial extension along a direction 132 parallel to the surface 112 of the substrate 110. The spatial extension along the direction 132 of the applied field 102 may be similar to the spatial extension along the direction 132 of the field generator 122. A field strength of the applied field 102 is spatially varied in the liquid 100 in a direction 132 parallel to the surface 112 of the substrate 110, thereby generating a spatially varied apparent viscosity distribution 104 in the liquid 100 in response to the applied field 102. The spatially varied apparent viscosity distribution 104 in the liquid 100 comprises portions 106 of higher apparent viscosity and portions 108 of lower apparent viscosity. The portions 106 of higher apparent viscosity in the liquid 100 may correspond to portions of higher field strengths in the liquid 100, as exemplified in FIG. 1B. The portions 108 of lower apparent viscosity in the liquid 100 may correspond to portions of lower field strengths in the liquid 100. In other words, the portions 106 of higher apparent viscosity in the liquid 100 have apparent viscosities above a predetermined value, such that the portions 106 may be used as a mask for a surface modifying process.

The liquid 100 may be a magnetorheological liquid and the field 102 may be a magnetic field. The magnetorheological liquid may comprise a shear-thinning additive or a shear-thickening additive, and a magnetic additive. The shear-thinning and the shear-thickening additives may be one or more of hexadecyltrimethylammonium bromide and a p-toluene sulfonate in aqueous media; poly(4-vinylpyridine) and suitable cross linkers in dimethylsulphoxide (DMSO) or N,N-dimethylformamide (DMF); poly(lactic acid) and chitosan in aqueous media; polysaccharides such as xanthan gum and starch in aqueous media; silica nanoparticles in poly(ethylene glycol) or aqueous media; or diethanolammonium acetate. It is to be understood that the above additives may induce a shear-thinning or a shear-thickening depending on a concentration of the additive and/or a pH of the liquid 100, 500.

The magnetic additives may be colloidal magnetic nanoparticles such as $CrO_2$ or $(Fe, Co, Ni)_3O_4$ or Fe, Co, Ni, Cr and Mn or alloys thereof with or without core-shell structure stabilized by surfactants in aqueous media; metal complexes such as porphyrin-based or crown ether-based or amino-based complexes of Cr, Mn, Fe, Co and Ni; microwires or microrods made of carbonyl Fe, Co, Ni, Cr and Mn or alloys thereof dispersed in non-aqueous media or stabilized in aqueous media; and/or silica-coated microparticles and/or disordered nanoparticles made of iron, cobalt, nickel, chromium and manganese or alloys thereof. Herein, disordered nanoparticles are intended as comprising atoms arranged in a vitreous and/or amorphous metastable fashion, such that no magnetic ordering takes place.

A strength of the magnetic field may correspond to a magnetic flux density in a range from 0.1 to 5 T.

The liquid 100 may be an electrorheological liquid and the field 102 may be an electric field.

The electrorheological liquid may comprise suspensions of dielectric particles up to 100 μm diameter and/or nanoparticles with dimensions in a range from 1 to 100 nm. The dielectric particles may be made of polysaccharides, glass, silica, alumina, ceria, zirconia and/or titanium dioxide. The nanoparticles may be composed of a core made of group II titanate oxalate and a shell made of urea. The nanoparticles may be magnesium, calcium, strontium or barium titanyl oxalate nanoparticles coated with urea. The dielectric particles and/or nanoparticles may be dispersed in a carrier liquid. The carrier liquid may comprise silicone oil, hydrocarbons, ethers, esters, carboxylic acids and/or supercritical gases.

A strength of the electric field may be less than 3 kV/mm. Electric fields higher than 3 kV/mm may cause electrical breakdown of air.

The assembler 120 and/or the field generator 122 may be arranged such that a field strength of the applied field 102 is spatially varied in the liquid 100 in a direction parallel 132 to the surface 112 of the substrate 110. The assembler 120 and/or the field generator 122 may be arranged such that a field strength of the applied field 102 in the liquid 100 is varied less in a direction 134 perpendicular to the surface 112 of the substrate 110 than in a direction 132 parallel to the surface. The spatially varied apparent viscosity distribution 104 may thereby be varied less in the direction 134 perpendicular to the surface 112 of the substrate 110 than in the direction 132 parallel to the surface 112 of the substrate 110. The assembler 120 and/or the field generator 122 may be arranged to apply the field 102 in the liquid 100. The assembler 120 and/or the field generator 122 may be arranged such that the applied field 102 in the liquid 100 has a main direction at an angle relative to the surface 112 of the substrate 110. The angle between the main direction of the applied field 102 and the surface 112 of the substrate 110 may be 90°±10%. The assembler 120 and/or the field generator 122 may be arranged such that the spatially varied apparent viscosity distribution has a spatial resolution on the order of 1 μm or larger.

The assembler 120 may comprise a plurality of field generators 122. The plurality of field generators 122 may be arranged in a matrix. In other words, the assembler 120 and the plurality of field generators 122 may be arranged to produce a predetermined field structure over the surface of the assembler 120. The field generator 122 may be a permanent magnet. The field generator 122 may be a coil arranged for generating a magnetic field. In case the field generator 122 is a coil arranged for generating a magnetic field, each field generator 122 of the plurality of field generators 122 arranged in a matrix may be activated and deactivated, thereby resulting in an adjustable field structure over the surface of the assembler 120.

The assembler 120 may comprise a further element 124, as exemplified in FIG. 1C. The assembler 120 and the further element 124 of the assembler may be used to apply the field 102 to the liquid 100. The further element 124 may comprise a further field generator 126. The further element 124 may comprise a plurality of further field generators. Each further field generator of the plurality of field generators may be electrically insulated from each other. The assembler 120 and the further element 124 of the assembler 120 may be used to apply an electric field to the liquid 100. The electric field may be applied to the liquid 100 by applying a voltage between the field generator 122 and an oppositely arranged further field generator 124, as exemplified in FIG. 1C. It is to be understood that the applied voltage between each pair of oppositely arranged field generators 122 and further field generators 124 may vary.

The surface 112 of the substrate 110 is then patterned S306 by subjecting the surface 112 to a surface modifying process 40, while maintaining the field and using portions of the liquid 100 having apparent viscosities higher than a predetermined value as a mask.

A pattern on the patterned surface may have a spatial resolution corresponding to the spatial resolution of the spatially varied apparent viscosity distribution 104. In other words, the pattern on the patterned surface may be on the order of 1 μm or larger. Portions 106 of higher apparent viscosity in the liquid 100 may have a lower probability of mass transport of deposition material than portions 108 of lower apparent viscosity in the liquid 100. Portions 106 of higher apparent viscosity in the liquid 100 may have a lower probability of mass transport of reactive species than portions 108 of lower apparent viscosity in the liquid 100. Thereby, portions of the surface 112 of the substrate 110 in contact with portions 108 of the liquid 100 having lower apparent viscosity may predominantly be subjected to the surface modifying process. A surface modifying process 40 comprising depositing S404 material on the surface 112 of the substrate 110 will be exemplified in relation to FIG. 2A and FIG. 2E, and a surface modifying process 40 comprising removing S402 material of the surface 112 of the substrate 110 will be exemplified in relation to FIG. 2B.

Figure 2A:
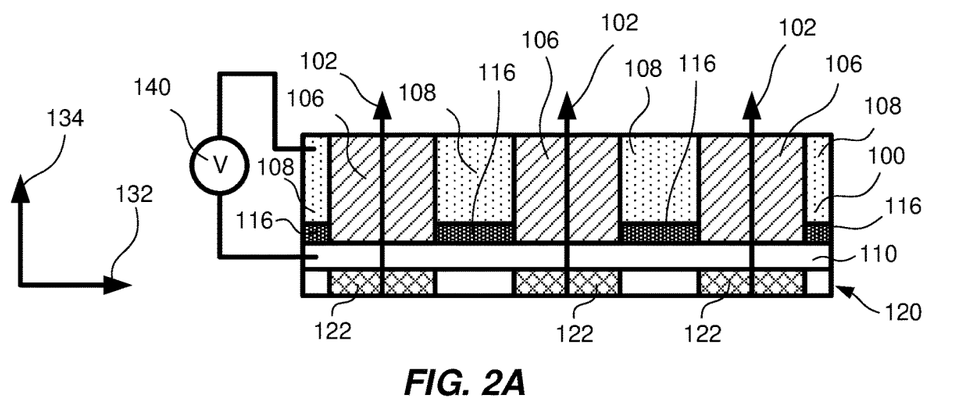
FIG. 2A illustrates a surface modifying process in which a voltage is applied between the liquid and the surface of the substrate.

The surface modifying process 40 may comprise depositing S404 material on the surface 112 of the substrate 110, as exemplified in FIG. 2A. In the example shown in FIG.

2A, deposited material 116 is present on portions of the surface 112 of the substrate 110. The deposited material 116 may be deposited on portions of the surface 112 of the substrate 110 that predominantly correspond to portions 108 of the liquid 100 having lower apparent viscosities. Material may be deposited on the surface 112 of the substrate 110 by electrodeposition. The material to be deposited may be comprised in the applied liquid 100. The material to be deposited may be one or more of a metallic alloy, a semiconducting material, a nanoparticle, an insulator, and a dielectric material.

The material modifying process 40 may comprise applying S408 a voltage 140 between the liquid 100 and the surface 112 of the substrate 110. Thereby, material species comprised in the liquid 100 may be deposited on the surface 112 of the substrate 110, as exemplified in FIG. 2A.

The surface modifying process 40 may comprise applying S410 a deposition magnetic field in the liquid 100, thereby depositing material species present in the liquid 100 on the surface 112 of the substrate 110.

Figure 2B:
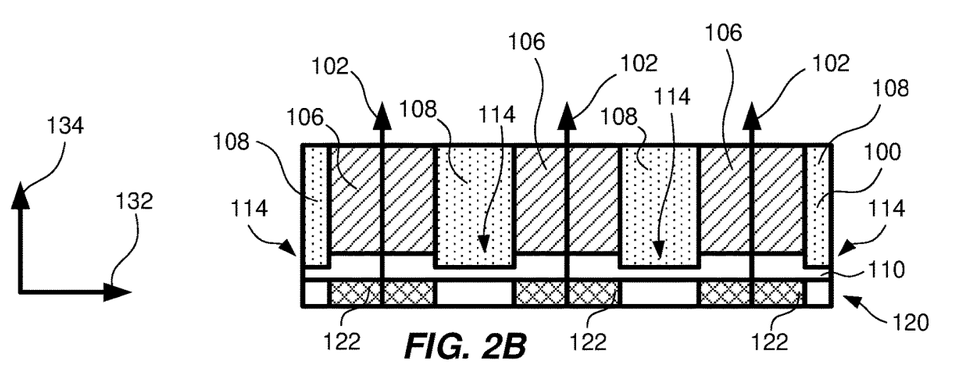
FIG. 2B illustrates a surface modifying process in which material of the surface is removed.

The surface modifying process 40 may comprise removing S402 material of the surface 112 of the substrate 110, as exemplified in FIG. 2B. In the example shown in FIG. 2B, material of portions 114 of the surface 112 of the substrate 110 have been removed. The portions 114 of the surface 112 of the substrate 110 where material have been removed may predominantly correspond to portions 108 of the liquid 100 having lower apparent viscosities than the portions 106. Material of the surface 112 of the substrate 110 may be removed by using reactive species. Material of the surface 112 of the substrate 110 may be removed by etching. The reactive species may be comprised in the applied liquid 100. The reactive species may be used in etching of the surface 112 of the substrate 110. The reactive species may be one or more of an inorganic acid, a basic alkaline solution, a peroxide, a complexant, and a coordinative ligand. The removal of material of the surface 112 of the substrate 110 may be induced by applying a voltage between the liquid 100 and the surface of the substrate 110.

Figure 2C:
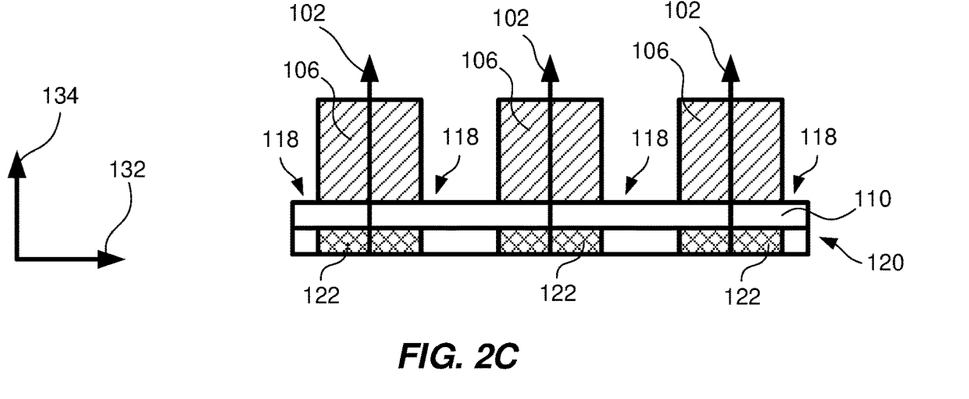
FIG. 2C illustrates the substrate when portions of the liquid having apparent viscosities lower than a predetermined value has been removed.

Prior to patterning S306 the surface 112 of the substrate 110, portions 108 of the liquid 100 having apparent viscosities lower than a predetermined value may be removed, as exemplified in FIG. 2C. Portions 118 of the surface 112 of the substrate 110 corresponding to the portions 108 of the liquid 100 having apparent viscosities lower than the predetermined value may thereby be exposed.

The predetermined value may be in a range from $10^{-1}$ Pas to $10^{-2}$ Pas. The liquid 100 may be removed by a pump. The liquid 100 may be removed by rinsing the surface 112 of the substrate 110 sequentially with solvents having opposite polarities. The liquid 100 may be removed by tilting the substrate 110. In case the liquid 100 is removed by tilting the surface 112 of the substrate 110, the applied field 102 may be tilted such that the portions 106 of the liquid 100 having apparent viscosities higher than the predetermined value are maintained upon tilting. The applied field 102 may be tilted by tilting the assembler 120.

Figure 2D:
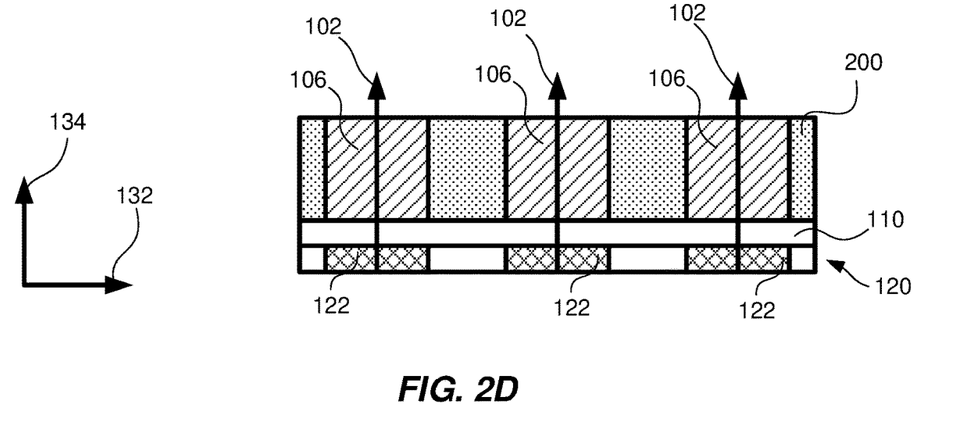
FIG. 2D illustrates a surface modifying process in which a processing fluid is applied to the substrate.

A processing liquid 200 may be applied S310 to the exposed portions 118 of the surface 112 of the substrate 110, as exemplified in FIG. 2D. The processing liquid 200 may be used in the surface modifying process 40.

The processing liquid 200 may be immiscible with the liquid 100. The processing liquid 200 may be applied S310 prior to patterning S306 the surface 112 of the substrate 110. The processing liquid 200 may comprise material species. The material species may be deposited on the surface 112 of the substrate 110 in the surface modifying process 40.

Alternatively, material of the surface 112 of the substrate 110 may be removed in the surface modifying process 40 by using reactive species contained in the processing liquid 200. Material of the surface 112 of the substrate 110 may be removed by etching. The reactive species may be comprised in the applied processing liquid 200. The reactive species may be used in etching of the surface 112 of the substrate 110. The reactive species may be one or more of an inorganic acid, a basic alkaline solution, a peroxide, a complexant, and a coordinative ligand. The removal of material of the surface 112 of the substrate 110 may be induced by applying a voltage between the liquid 100 and the surface of the substrate 110.

Figure 2E:
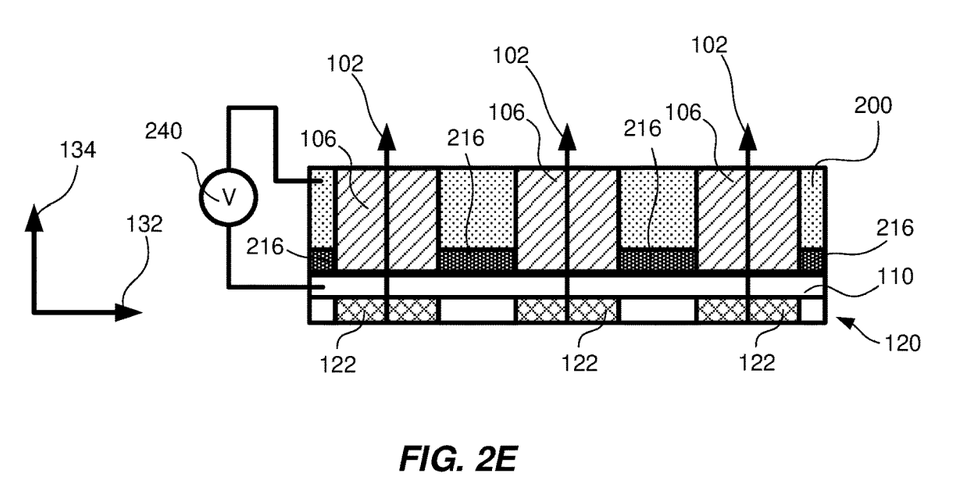
FIG. 2E illustrates a surface modifying process in which a voltage is applied between the processing liquid and the surface of the substrate.

The surface modifying process 40, as exemplified in FIG. 2E, may comprise applying S406 a voltage 240 between the processing liquid 200 and the surface 112 of the substrate 110. Material species present in the processing liquid 200 may thereby be deposited on the exposed portions 118 of the surface 112 of the substrate 110.

In the example shown in FIG. 2E, deposited material 216 is present on portions of the surface 112 of the substrate 110. The deposited material 216 may be deposited on portions of the surface 112 of the substrate 110 that are in contact with the processing liquid 200. In other words, the deposited material 216 may predominantly be deposited on the exposed portions 118 of the surface 112 of the substrate 110 that is in contact with the processing liquid 200. The applied voltage 240 between the processing liquid 200 and the surface 112 of the substrate 110 may be a negative or a positive voltage. The applied voltage 240 may induce electrodeposition, thereby depositing material species comprised in the processing liquid 200, as exemplified in FIG. 2E. The applied voltage 240 may induce electroreduction or anodization of the exposed portions 118 of the surface 112 of the substrate 110. The applied voltage 240 may induce etching of the surface 112 of the substrate 110, material deposition on the surface 112 of the substrate 110, and/or passivation of the surface 112 of the substrate 110. Passivation of the surface 112 of the substrate 110 may comprise forming an oxide, a chalcogenide or a pnictide outgrowth.

Subsequent to patterning S306 the surface 112 of the substrate 110, the applied field 102 may be removed S312, thereby diminishing the spatially varied apparent viscosity distribution 104 in the liquid 100.

The surface 112 of the substrate 110 may be patterned S306 using any of the surface modifying processes 40 described in relation to FIG. 2A-2E.

Subsequent to removing S312 the applied field 102, a further field may be applied to the liquid 100. A further field strength of the further field may be spatially varied in the liquid 100 in a direction parallel 132 to the surface 112 of the substrate 110, thereby generating a further spatially varied apparent viscosity distribution in the liquid 100 in response to the applied further field.

In case the surface 112 of the substrate 110 has been patterned S306, the direction parallel 132 to the surface 112 of the substrate 110 may be the direction 132 parallel to the surface 112 of the substrate 110 prior to patterning S306 the surface 112 of the substrate 110.

The surface of the substrate 110 may be patterned S316 by subjecting the surface to a further surface modifying process, while maintaining the further field and using portions of the liquid 100 having apparent viscosities higher than a predetermined value as a further mask.

The further surface modifying process may correspond to the surface modifying process 40. The further surface modifying process may correspond to one of the surface modifying processes 40 described in relation to FIG. 2A-2E.

The surface of the substrate 110 may comprise deposited material species.

The applied further field may be removed S318, thereby diminishing the further spatially varied apparent viscosity distribution in the liquid 100.

The liquid 100 may be removed S320 from the patterned surface of the substrate 110.

The liquid 100 may be removed S320 from the patterned surface of the substrate 110 using a squeegee. The liquid 100 may be removed S320 from the patterned surface of the substrate 110 by tilting the patterned surface of the substrate 110. The patterned surface of the substrate 110 may be tilted by tilting the substrate 110. The liquid 100 may be removed S320 by rinsing the patterned surface of the substrate 110 sequentially with solvents having opposite polarities.

Figure 3:
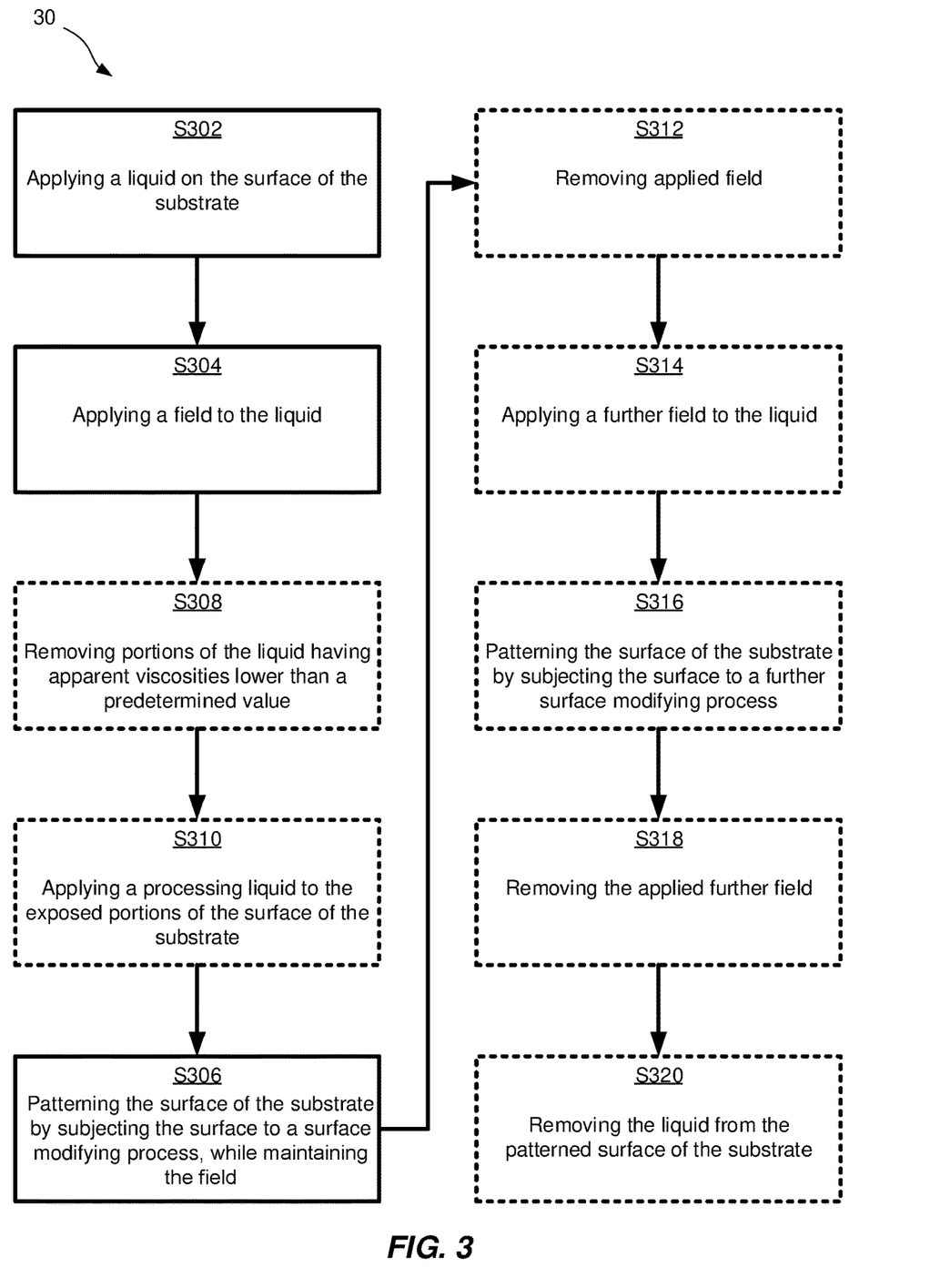
FIG. 3 is a block scheme of a method for patterning a surface on a substrate.

FIG. 3 is a block scheme of a method 30 for patterning a surface 112 on a substrate 110. The method 30 comprises applying S302 a liquid 100 on the surface 112 of the substrate 110. An apparent viscosity of the liquid 100 depends on a field strength applied to the liquid 100.

The method 30 further comprises applying S304 a field 102 to the liquid 100. A field strength of the applied field 102 is spatially varied in the liquid 100 in a direction 132 parallel to the surface 112 of the substrate 110, thereby generating a spatially varied apparent viscosity distribution 104 in the liquid 100 in response to the applied field 102.

The method 30 further comprises patterning S306 the surface 112 of the substrate 110 by subjecting the surface 112 to a surface modifying process 40, while maintaining the field and using portions of the liquid 100 having apparent viscosities higher than a predetermined value as a mask. The liquid 100 may be a magnetorheological liquid and the field 102 may be a magnetic field.

The liquid 100 may be an electrorheological liquid and the field 102 may be an electric field.

The method 30 may further comprise, prior to patterning S306 the surface 112 of the substrate 110, removing S308 portions 108 of the liquid 100 having apparent viscosities lower than a predetermined value, thereby exposing corresponding portions 118 of the surface 112 of the substrate 110.

The method 30 may further comprise applying S310 a processing liquid 200 to the exposed portions 118 of the surface 112 of the substrate 110. The processing liquid 200 may be used in the surface modifying process 40.

The method 30 may further comprise, subsequent to patterning S306 the surface 112 of the substrate 110, removing S312 the applied field 102, thereby diminishing the spatially varied apparent viscosity distribution 104 in the liquid 100.

The method 30 may further comprise applying S314 a further field to the liquid 100, wherein a further field strength of the further field is spatially varied in the liquid 100 in a direction 132 parallel to the surface 112 of the substrate 110, thereby generating a further spatially varied apparent viscosity distribution in the liquid 100 in response to the applied further field.

The method 30 may further comprise patterning S316 the surface of the substrate 110 by subjecting the surface to a further surface modifying process, while maintaining the further field and using portions of the liquid 100 having apparent viscosities higher than a predetermined value as a further mask.

The method 30 may further comprise removing S318 the applied further field, thereby diminishing the further spatially varied apparent viscosity distribution in the liquid 100.

The method 30 may further comprise removing S320 the liquid 100 from the patterned surface of the substrate 110.

Figure 4:
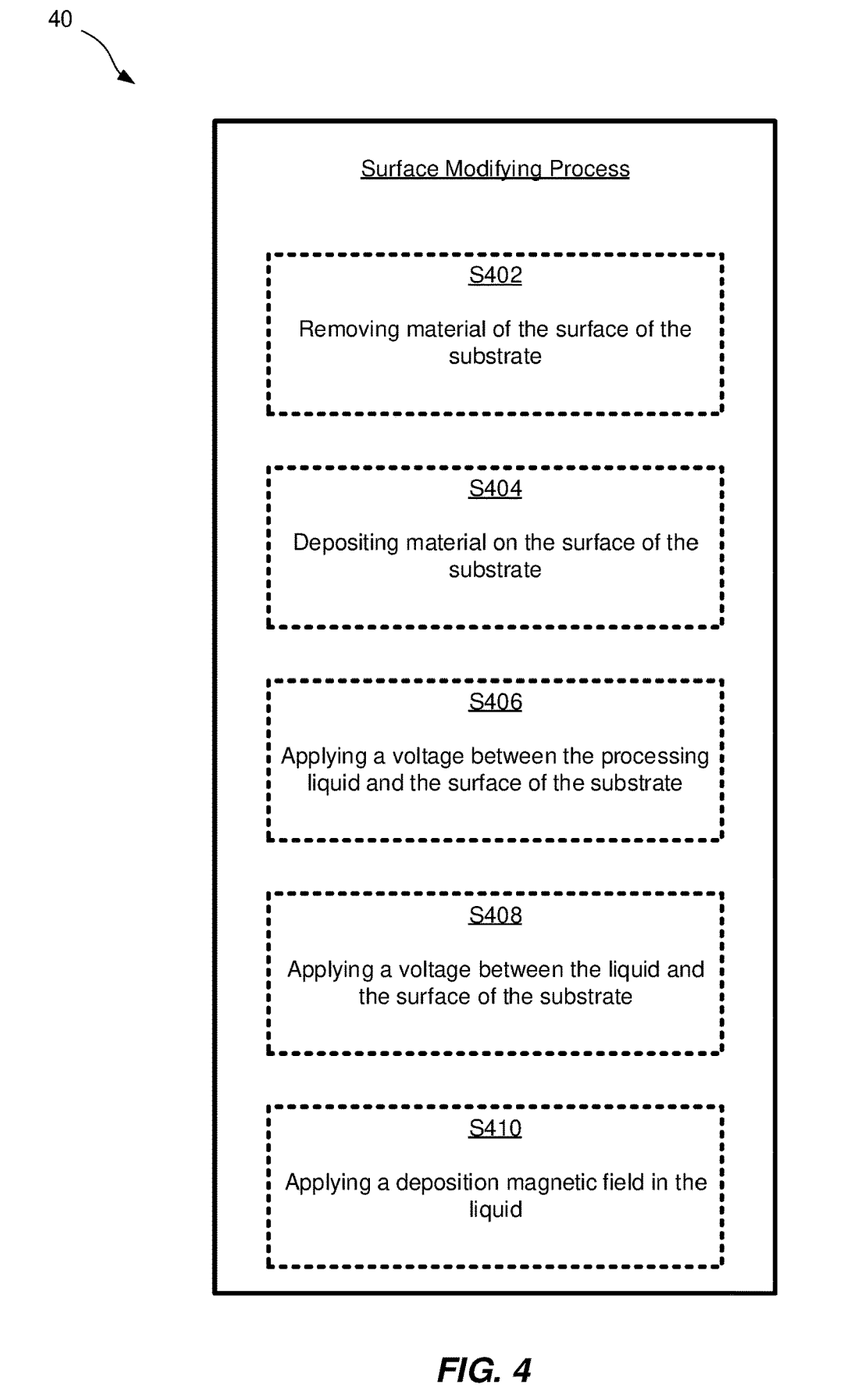
FIG. 4 is a block scheme of a surface modifying process.

FIG. 4 is a block scheme of a surface modifying process 40.

The surface modifying process 40 may comprise removing S402 material of the surface 112 of the substrate 110.

The surface modifying process 40 may comprise depositing S404 of material on the surface 112 of the substrate 110.

The surface modifying process 40 may comprise applying S406 a voltage 240 between the processing liquid 200 and the surface 112 of the substrate 110, thereby depositing material species present in the processing liquid 200 on the exposed portions 118 of the surface 112 of the substrate 110.

The surface modifying process 40 may comprise applying S408 a voltage 140 between the liquid 100 and the surface 112 of the substrate 110, thereby depositing material species present in the liquid 100 on the surface 112 of the substrate 110.

The surface modifying process 40 may comprise applying S410 a deposition magnetic field in the liquid 100, thereby depositing material species present in the liquid 100 on the surface 112 of the substrate 110.

In FIG. 5, a field 102 has been applied S304 to a liquid 500. The liquid 500 may be a shear-thinning liquid. The field 102 may be applied by the assembler 120, as exemplified in FIG. 5. The assembler 120 may comprise a field generator 122. The assembler 120 may comprise a plurality of field generators. Each field generator 122 in the plurality of field generators may be electrically isolated from each other. The plurality of field generators may be arranged in a two-dimensional manner. The plurality of field generators may be arranged in a three-dimensional manner. A field strength of the applied field 102 is spatially varied in the liquid 500 in a direction 132 parallel to the surface 112 of the substrate 110, thereby generating a spatially varied apparent viscosity distribution 504 in the liquid 500 in response to the applied field 102. The spatially varied apparent viscosity distribution 504 in the liquid 500 comprises portions 506 of higher apparent viscosity and portions 508 of lower apparent viscosity. The portions 508 of lower apparent viscosity in the liquid 500 may correspond to portions of higher field strengths in the liquid 500, as exemplified in FIG. 5. The portions 506 of higher apparent viscosity in the liquid 500 may correspond to portions of lower field strengths in the liquid 500.

The present inventive concept will now be further described in the following examples of patterned electroplating and electroetching with magnetorheological and electrorheological liquids.

Example 1—Shear-Thickening Magnetorheological Liquid

All concentrations (volumetric, molar, wt. %, etc.) given in this example are in relation to the complete (i.e. comprising all constituents) liquid. The liquid may be diluted with water in order to achieve the desired concentrations.

In this first example, a shear-thickening magnetorheological liquid is used in a process where metallic nickel is deposited on a non-conducting plastic substrate. The surface of the plastic substrate was pretreated (e.g., by plasma or corona treatment) such that it can be plated. The shear-thickening additive of the magnetorheological liquid in this example is hexadecyltrimethylammonium bromide at a concentration of 0.3 M and p-toluene sulfonate at a concentration of 0.5 M in water. The magnetic additive of the magnetorheological liquid in this example is silica-coated iron microparticles at a concentration of 15 wt. % and silica-coated disordered chromium nanoparticles at a concentration of 20 wt. %. Ammonia and ammonium sulphate were added to the magnetorheological liquid such that the liquid has a pH of 5.0.

The concentrations given above are to be seen as examples only, it has been found that they may be varied. For example, in the shear-thickening magnetorheological liquid, the concentration of hexadecyltrimethylammonium bromide may be within a range from 0.05 M to 1.5 M, the concentration of p-toluene sulfonate may be within a range from 0.05 M to 1.5 M, the concentration of silica-coated iron microparticles (size distribution of 50±20 μm) may be within a range from 5 wt. % to 50 wt. %, and the concentration of silica-coated disordered chromium nanoparticles (size distribution of 10±5 nanometers) from 5 wt. % to 50 wt. %.

In this example, a spatially-varied magnetic field was applied, such that the spatially varied apparent viscosity distribution in the liquid prevents nickel from being deposited on portions of the substrate where the apparent viscosity of the liquid is sufficiently high to essentially prevent nickel ions from migrating towards the surface.

In this first example, the surface modifying process is electroless plating, i.e. a surface modifying process comprising depositing material on the surface of the substrate without applying a deliberate voltage to the substrate. Here, aqueous nickel monosulphate (concentration between 1 and 50 grams per liter) is present in the magnetorheological liquid, and is deposited using electroless plating, by chemically reducing the nickel ions to metallic nickel by means of a reducing agent such as alkali or ammonium hypophosphite (concentration between 5 and 50 grams per litre). It has further been found that the surface modifying process is enhanced in case the magnetorheological liquid has a pH between 4.0 and 5.5, why a pH stabilizer, e.g. ammonia and ammonium sulphate, may be added. It has further been found that it is beneficial for the process to keep the magnetorheological liquid at a temperature between 60° C. and 100° C.

Example 2—Shear-Thinning Magnetorheological Liquid

All concentrations (volumetric, molar, wt. %, etc.) given in this example are in relation to the complete (i.e. comprising all constituents) liquid. The liquid may be diluted with water in order to achieve the desired concentrations.

In this second example, a shear-thinning magnetorheological liquid is used in a process where CdTe films are deposited on a conducting aluminum foil. The shear-thinning additive of the magnetorheological liquid in this example is xanthan gum powder at a concentration of 5 gram per liter. The magnetic additive of the magnetorheological liquid in this example is silica-coated iron microparticles at a concentration of 1 wt. % and silica-coated disordered chromium nanoparticles at a concentration of 5 wt. %.

The concentrations given above are to be seen as examples only, it has been found that they may be varied. For example, in the shear-thinning magnetorheological liquid, the concentration of xanthan gum powder may be within a range from 0.01 gram per liter to 10 gram per liter, the concentration of silica-coated iron microparticles may be within a range from 0.1 wt. % to 10 wt. %, and the concentration of silica-coated disordered chromium nanoparticles from 5 wt. % to 50 wt. %.

In this example, a spatially-varied magnetic field was applied, such that the spatially varied apparent viscosity distribution in the liquid facilitates the deposition of Cd and Te on portions of the substrate where the apparent viscosity of the liquid is sufficiently low to essentially enable Cd and Te to migrate towards the surface.

In this second example, the surface modifying process is electroplating, i.e. a surface modifying process comprising depositing material on the surface of the substrate by applying a deliberate voltage to the substrate. Here, $CdSO_4$ (concentration between 0.05 M and 2 M) and $TeO_2$ (concentration between $10^{-5}$ M and $10^{-2}$ M) are present in the magnetorheological liquid and are deposited using electroplating under potentiostatic conditions. The magnetorheological fluid further comprises $H_2SO_4$ (concentration between 0.01 M and 0.5 M) in order to balance the electrochemical process. It has further been found that the surface modifying process is enhanced in case the magnetorheological liquid has a pH between 1.8 and 2.2, why a pH stabilizer, e.g. dipotassium sulphate may be added. It has further been found that it is beneficial for the process to keep the magnetorheological liquid at a temperature between 60° C. and 100° C.

Example 3—Shear-Thickening Electrorheological Liquid

All concentrations, unless explicitly stated otherwise, (volumetric, molar, wt. %, etc.) given in this example are in relation to the complete (i.e. comprising all constituents) liquid. The liquid may be diluted with silicone oil in order to achieve the desired concentrations.

In this third example, a shear-thickening electrorheological liquid is used in a process where Mo is etched from a Mo-coated silicon wafer.

The shear-thickening additive of the electrorheological liquid in this example is silica nanoparticles at a concentration of 10 wt. % in silicone oil, whereby wt. % here is with respect to the silicone oil. The electrorheological additive of the electrorheological liquid in this example is barium titanyl oxalate [$BaTiO(C_2O_4)_2$] nanoparticles (concentration of 20 volumetric %) coated with urea.

The concentrations given above are to be seen as examples only, it has been found that they may be varied. For example, in the shear-thickening electrorheological liquid, the concentration of silica nanoparticles may be within a range from 5 wt. % to 25 wt. %, and the concentration of barium titanyl oxalate nanoparticles may be within a range from 5 volumetric % to 40 volumetric %.

In this example, a spatially-varied electric field was applied, such that the spatially varied apparent viscosity distribution in the liquid prevents the oxidizing species from etching portions of the substrate where the apparent viscosity is sufficiently high to essentially prevent the oxidizing species from migrating towards the surface.

In this third example, the surface modifying process is electroless etching, i.e. a surface modifying process comprising etching material on the surface of the substrate without applying a deliberate voltage to the substrate. Moreover, a sodium hypochlorite solution (concentration from 1 wt. % to 29 wt. %) is added as a second liquid to the electrorheological liquid, and used as oxidizing species during etching. The second liquid is non-miscible with the electrorheological liquid. The second liquid may alternatively be used as a processing liquid (i.e. added on the substrate after removing portions of the electrorheological liquid having apparent viscosities low enough for the electrorheological liquid to be removed). It has further been found that it is beneficial for the process to keep the electrorheological liquid at a temperature between 5° C. and 100° C.

Example 4—Shear-Thinning Electrorheological Liquid

All concentrations (volumetric, molar, wt. %, etc.) given in this example are in relation to the complete (i.e. comprising all constituents) liquid. The liquid may be diluted with an ionic liquid in order to achieve the desired concentrations. In this fourth example, the ionic liquid is diethanolammonium acetate [(HOEt)$_2$NH.AcOH].

In this fourth example, a shear-thinning electrorheological liquid is used in a process where lithium is deposited on the surface of a conductive graphite electrode.

The shear-thinning additive of the electrorheological liquid in this example is diethanolammonium acetate at a concentration of 70 wt. %. The electrorheological additive of the electrorheological liquid in this example is barium titanyl oxalate [BaTiO(C$_2$O$_4$)$_2$] nanoparticles (concentration of 20 volumetric %) coated with urea. The electrorheological fluid further comprises a polyethylene glycol dispersant at a concentration of 5 wt. %.

The concentrations given above are to be seen as examples only, it has been found that they may be varied. For example, in the shear-thinning electrorheological liquid, the concentration of diethanolammonium acetate may be within a range from 60 wt. % to 95 wt. %, the concentration of barium titanyl oxalate nanoparticles may be within a range from 5 volumetric % to 35 volumetric %, and the concentration of polyethylene glycol dispersant may be within a range from 5 wt. % to 20 wt. %.

In this example, a spatially-varied electric field was applied, such that the spatially varied apparent viscosity distribution in the liquid facilitates the deposition of lithium on portions of the substrate where the apparent viscosity of the liquid is sufficiently low to essentially enable lithium ions to migrate towards the surface.

In this fourth example, the surface modifying process is electroplating, i.e. a surface modifying process comprising depositing material on the surface of the substrate by applying a deliberate voltage. Here, LiPF$_6$ at a concentration of 5 wt. % is present in the electrorheological liquid, and deposited on the surface by electroplating. It has further been found that it is beneficial for the process to keep the electrorheological liquid at a temperature between 60° C. and 100° C.

The person skilled in the art realizes that the present inventive concept by no means is limited to the preferred variants described above. On the contrary, many modifications and variations are possible within the scope of the appended claims.

For example, the surface modifying process 40 may comprise more than one of the surface modifying processes 40 described in relation to FIG. 2A-FIG. 2E.

Additionally, variations to the disclosed variants can be understood and effected by the skilled person in practicing the claimed invention, from a study of the drawings, the disclosure, and the appended claims.

The invention claimed is:

1. A method for patterning a surface of a substrate, the method comprising:

applying a shear-thickening or shear-thinning liquid on the surface of the substrate, wherein an apparent viscosity of the liquid depends on a field strength applied to the liquid;

applying a field to the shear-thickening or shear-thinning liquid, wherein a field strength of the applied field is spatially varied in the shear-thickening or shear-thinning liquid in a direction parallel to the surface of the substrate, thereby generating a spatially varied apparent viscosity distribution in the liquid in response to the applied field such that the shear-thickening or shear-thinning liquid comprises portions of higher apparent viscosity and portions of lower apparent viscosity;

patterning the surface of the substrate by subjecting the surface to a surface modifying process, while maintaining the field and using portions of the shear-thickening or shear-thinning liquid having apparent viscosities higher than a predetermined value as a mask;

wherein the shear-thickening or shear-thinning liquid comprises an electrodeposition solution or an etching solution, the electrodeposition solution or the etching solution each comprising one or more of an additive or reactive species selected from the group consisting of: ions, ionic liquid, an acid, an alkaline solution, a pH stabilizer, a peroxide, a complexant, a coordinative ligand, a reducing agent, an oxidizing species, a dispersant, a metallic alloy, a semiconducting material, a nanoparticle, an insulator, and a dielectric material; and, wherein the surface modifying process comprises depositing material on the surface of the substrate, the depositing material is one or more of the metallic alloy, the semiconducting material, the nanoparticle, the insulator, or the dielectric material additive from the shear-thickening or shear-thinning liquid.

2. The method according to claim 1, wherein the surface modifying process is carried out by applying a voltage.

3. The method according to claim 1, wherein the shear-thickening or shear-thinning liquid is a magnetorheological liquid and the field applied is a magnetic field.

4. The method according to claim 3, wherein the surface modifying process comprises applying a voltage between the liquid and the surface of the substrate, thereby depositing material species present in the liquid on the surface of the substrate.

5. The method according to claim 1, wherein the shear-thickening or shear-thinning liquid is an electrorheological liquid and the field applied is an electric field.

6. The method according to claim 1, further comprising, subsequent to patterning the surface of the substrate, removing the applied field, thereby diminishing the spatially varied apparent viscosity distribution in the liquid.

7. The method according to claim 6, further comprising:

applying a further field to the liquid, wherein a further field strength of the further field is spatially varied in the liquid in a direction parallel to the surface of the substrate, thereby generating a further spatially varied apparent viscosity distribution in the liquid in response to the applied further field;

patterning the surface of the substrate by subjecting the surface to a further surface modifying process, while maintaining the further field and using portions of the liquid having apparent viscosities higher than a predetermined value as a further mask;

removing the applied further field, thereby diminishing the further spatially varied apparent viscosity distribution in the liquid.

8. The method according to claim 1, the method further comprising removing the liquid from the patterned surface of the substrate.

9. The method according to claim 1, wherein the method comprises, prior to patterning the surface of the substrate, removing portions of the liquid having apparent viscosities lower than the predetermined value, thereby exposing corresponding portions of the surface of the substrate.

10. The method according to claim 9, wherein the method comprises applying a processing liquid to the exposed portions of the surface of the substrate, wherein the processing liquid is used in the surface modifying process.

11. The method according to claim 10, wherein the surface modifying process comprises applying a voltage between the processing liquid and the surface of the substrate, thereby depositing material species present in the processing liquid on the exposed portions of the surface of the substrate.

* * * * *